United States Patent [19]

Burnham et al.

[11] E Patent Number: Re. 33,274

[45] Reissued Date of Patent: Jul. 24, 1990

[54] SELECTIVE DISORDERING OF WELL STRUCTURES BY LASER ANNEALING

[75] Inventors: Robert D. Burnham, Wheaton, Ill.; Noble M. Johnson, Menlo Park, Calif.

[73] Assignee: Xerox Corporation, Stamford, Conn.

[21] Appl. No.: 304,671

[22] Filed: Jan. 31, 1989

Related U.S. Patent Documents

Reissue of:

[64] Patent No.: 4,654,090
Issued: Mar. 31, 1987
Appl. No.: 775,979
Filed: Sep. 13, 1985

[51] Int. Cl.[5] ..... H01L 21/265; H01L 21/203

[52] U.S. Cl. ..... 437/174; 357/61; 357/91; 437/19; 437/25; 437/133; 148/DIG. 48; 148/DIG. 94

[58] Field of Search ..... 437/19, 25, 133, 174; 357/61, 91

[56] References Cited

U.S. PATENT DOCUMENTS

| | | | |
|---|---|---|---|
| 4,318,752 | 3/1982 | Tien | 148/1.5 |
| 4,330,363 | 5/1982 | Biegesen et al. | 156/620 |
| 4,378,255 | 3/1983 | Holonyak | 148/1.5 |
| 4,388,145 | 6/1983 | Hawkins et al. | 156/620 |
| 4,436,557 | 3/1984 | Wood et al. | 148/1.5 |
| 4,469,527 | 9/1984 | Sugano et al. | 148/1.5 |
| 4,503,447 | 3/1985 | Iafrate et al. | 148/DIG. 84 |
| 4,511,408 | 4/1985 | Holonyak, Jr. | 148/1.5 |
| 4,547,256 | 10/1985 | Gurtler et al. | 148/175 |
| 4,576,652 | 3/1986 | Hovel et al. | 148/1.5 |
| 4,578,127 | 3/1986 | Gossard et al. | 148/175 |
| 4,689,646 | 8/1987 | Matsumoto | 357/22 |

FOREIGN PATENT DOCUMENTS

| | | | |
|---|---|---|---|
| 0183023 | 11/1982 | Japan | 437/19 |

OTHER PUBLICATIONS

Cohen et al, Appl. Phys. Letts 33 (1978) 751.
Meehan et al., Jour. Appl. Phys. 55 (1984) 2672.
Greiner et al., Appl. Phys. Letts. 44 (1984) 750.
Kular et al., Solid St. Electronics, 27 (1984) 83.
Meehan et al., J. Appl. Phys. 54 (1983) 7190.
Coleman et al., Appl. Phys. Letts. 40 (1982) 904.

*Primary Examiner*—Upendra Roy

[57] ABSTRACT

A method of converting selected areas of a semiconductor structure into a disordered alloy comprising a well feature epitaxially deposited on a semiconductor support, the well feature comprising at least one first well layer of narrow bandgap material deposited adjacent to at least a second layer of wider bandgap material or interposed between second and third layers of wider bandgap material. The disordered alloy exhibits higher bandgap and lower refractive index properties than the first layer. The method comprises the steps of (1) either placing the structure within a protective environment to prevent the escape of volatile components from the structure during subsequent processing or alternatively, covering the structure with a protective coating to prevent the escape of any elemental component of the structure, (2) heating the structure to a background temperature [just] below the temperature required to achieve rapid thermal disordering of the well feature, (3) scanning the structure with a laser beam while maintaining the applied heat to selectively disorder the well feature due to the additional heat supplied by the laser beam forming a pattern of wider bandgap and lower refractive index properties prescribed in the feature by the scanning trace of the laser beam compared to areas of the feature not scanned by the laser beam. The well feature may be a quantum well structure comprising a single quantum well structure, a multiple quantum well structure or a separate confinement single quantum well or a separate confinement multiple quantum well or a heterostructure including an active region being the first layer.

13 Claims, 4 Drawing Sheets

SELECTIVE DISORDERING OF WELL STRUCTURES BY LASER ANNEALING

Matter enclosed in heavy brackets [ ] appears in the original patent but forms no part of this reissue specification; matter printed in italics indicates the additions made by reissue.

BACKGROUND OF THE INVENTION

This invention relates to semiconductor devices having well structures and more particularly to a method of selectively disordering regions or areas of such structures using laser annealing techniques.

The art of utilizing laser annealing as an effective means for treating semiconductor structures during their fabrication processes has mushroomed and has become extensive as an effective treatment before, during and after fabrication of semiconductor devices. Examples of such art are the conversion of predefined areas of amorphous or polycrystalline silicon or other semiconductor material into single crystal areas using laser beam annealing as exemplified in U.S. Pat. Nos. 4,330,363 and 4,388,145. Another example in U.S. Pat. No. 4,469,527 wherein a laser beam anneal is utilized to extinguish lattice defects in predefined areas of a substrate surface to render such areas semiconductive wherein the entire surface of the substrate had been previously rendered entirely semi-insulating through prior irradiation treatment.

In the early 1980's, techniques were developed for selective Zn diffusion of quantum well structures, e.g., having a single or multiple quantum well, comprised of semiconductor heterostructure materials, such as GaAs/GaAlAs, performed at temperatures (e.g., 600° C.) below the epitaxial growth temperatures (e.g., 750° C.) for such structures. See, for example, U.S. Pat. No. 4,378,255. The idea of a quantum well structure is to effect a basic improvement in the performance of such structures as utilized in various semiconductor devices, such as tunnel transistors, field effect transistors or semiconductor lasers, by confining carriers in a sufficiently narrow active region comprising a thin active well layer or layers to modify the band structure, thereby raising the lowest carrier states in the well or wells to a higher energy level. By utilizing thermal Zn diffusion, predefined areas of the quantum well structure may be disordered to form a disordered alloy that exhibits higher bandgap and lower refractive index properties compared to regions that are left undiffused. As a result, defined regions of higher bandgap can be created in a monolithic semiconductor structure or wafer useful in the fabrication of optical waveguides, current channels, semiconductor lasers, integrated optical electronic circuits and other types of integrated circuits.

More recently, it has been discovered that Si, Ge, Sn, K Al, S and other elements may be implanted and then annealed at temperatures at about 800° C. or above to provide the same disordering.

The fundamental advantage in utilizing these diffusion and implantation techniques is the ability to epitaxially grow semiconductor devices comprising two dimensional layers that include a well structure, which may or may not exhibit quantum size effects, and thereafter converting predefined or selected areas of the well structure into disordered material to form three dimensional semiconductor devices.

An attractive and simpler method of achieving this goal would involve laser beam annealing of predefined or selective areas of well structures to bring about thermal disordering, vis a vis thermal diffusion or implant disordering. However, there are several problems that must be overcome to utilize such a technique. First, relative to the GaAs/GaAlAs regime, for example, the temperature of the laser beam must exceed the epigrowth temperature so that free interdiffusion of Ga and Al in the well structure may be thermally induced. The areas of the wafer scanned by the laser beam need to be heated to an elevated temperature in a range above the epitaxial growth temperatures in order to bring about enhanced or accelerated interdiffusion. Utilizing such high temperatures in predefined small areas of the wafer will produce large lateral temperature gradients which may damage the overall quality of the epitaxially deposited materials rendering the wafer useless for the fabrication of semiconductor devices. Second, in the GaAs/GaAlAs regime, the loss of As from the epitaxial grown wafer may be critical due to its volatility at such high temperatures thereby rendering the wafer useless for device purposes. Third, a significant temperature gradient between regions annealed compared to regions not annealed may cause the wafer to be stressed or cracked rendering the wafer structure useless for device purposes.

Thus, the utilization of laser beam annealing to accomplish thermal disordering in well structures in and of itself is not sufficient to accomplish a practical method or process that will achieve selective disordering in predefined areas of a semiconductor wafer having an epitaxially grown well structure.

SUMMARY OF THE INVENTION

According to this invention, a method of converting predefined or selected areas of a semiconductor structure containing a well feature into a disordered alloy is realized by using a laser beam annealing technique. As used herein, the term "well" means a narrow bandgap material sandwiched between two wider bandgap materials and may embody either a quantum well structure or conventional heterostructures having an active region. Also, as used herein, the term "disordered" means partially disordered well features as well as fully disordered well features. Disordering techniques may also be applied to conventional heterostructures casing partial disordering between the active region and the adjacent wider bandgap cladding layers.

The semiconductor structure utilized in the method of this invention includes a well feature epitaxially deposited on a semiconductor support comprising at least a first well layer having high refractive index properties interposed between second barrier layers, wherein after the treatment via the method of this invention, the predefined areas of the disordered alloy will exhibit higher bandgap and lower refractive index properties compared to originally deposited first layer. These induced differences of bandgap regions provide excellent three dimensional monolithic structures for fabricating semiconductor devices as previously indicated.

The method comprises the steps of placing the semiconductor structure including a well feature within a protective environment to prevent the escape of volatile components from the structure during subsequent processing. Alternatively or in addition to the protective environment, the semiconductor structure may be encapsulated with a protective coating, such as, $SiO_2$ or $Si_3N_4$. Next, the semiconductor structure is uniformly heated to a temperature just below the temperature required to achieve enhanced thermal disordering of the well feature. This step significantly reduces the large lateral temperature gradient by elevating the ambient temperature of the semiconductor structure during the laser beam annealing process and maintaining the elevated temperature during such process. For example, the thermal disordering of GaAs/GaAlAs regime well structures occurs very slowly, if at all, at background temperatures in the range of 750° C. to 850° C.

The last step is scanning the semiconductor structure with a laser beam while maintaining the applied uniform heat to selectively disorder the well feature due to the additional heat supplied by the laser beam whereby a defined pattern of higher bandgap and lower refractive index properties is proscribed in the well feature by the scanning trace of the laser beam compared to areas of the feature not scanned by the laser beam. As previously indicated, the occurrence of disordering is practically nonexistent or very slow at background temperatures in the primary range of 750° C. to 850° C. Disordering, however, occurs very rapidly when the temperature gradient is increased via a laser beam by only 25° C. to 50° C. above this primary range. Not only would the power of the laser beam need not be high to accomplish this gradient difference but also the possibility of damaging lateral thermal gradients is significantly reduced due to the use of only slightly higher elevated temperatures above the primary uniform heating of the semiconductor structure.

Other objects and attainments together with a fuller understanding of the invention will become apparent and appreciated by referring to the following description and claims taken in conjunction with the accompanying drawings.

DETAILED DESCRIPTION OF ILLUSTRATIVE EMBODIMENTS

Figure 1:
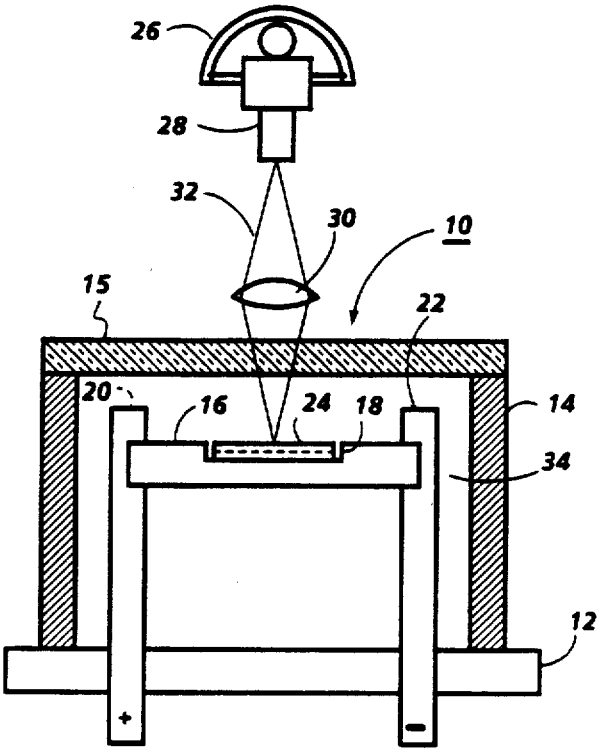
FIG. 1 schematically illustrates fundamental apparatus for practicing this invention.

Reference is now made to FIG. 1 wherein there is disclosed apparatus 10 for carrying out this invention. Apparatus 10 comprises a base or support 12 to which is secured an enclosure or housing 14 providing a processing chamber 34. The top wall 15 of housing 14 comprises a transparent window, e.g. quartz. Within chamber 34 is a graphic heater element 16 supported by legs 20 and 22 which also function as electrode leads for element 16. Element 16 has a central recess 18 within which is supported the semiconductor structure or wafer 24, positioned for processing in chamber 34. Heater element 16 functions as the primary heat source for heat treatment of structure 24. As an alternative heating source, an RF heater coil may be provided around the exterior of the housing 14 in lieu of a heating element in chamber 34.

Supported above housing 14 is laser scanner 26 supporting laser 28. Laser 28 may be a semiconductor laser device. Laser 28 produces a laser beam 32 which is focused by lens 30 through window 15 onto the surface of structure 24. Lens 30 forms part of the scanning structure 26 but is shown here as a separate component for purposes of illustration. Beam 32 is scanned across the surface of wafer 24 by scanner 26 in a predetermined fashioned to selectively disorder specific areas of wafer 24. The wavelength of beam 32 is selected to be highly absorptive for the material to undergo disordering.

Figure 3:
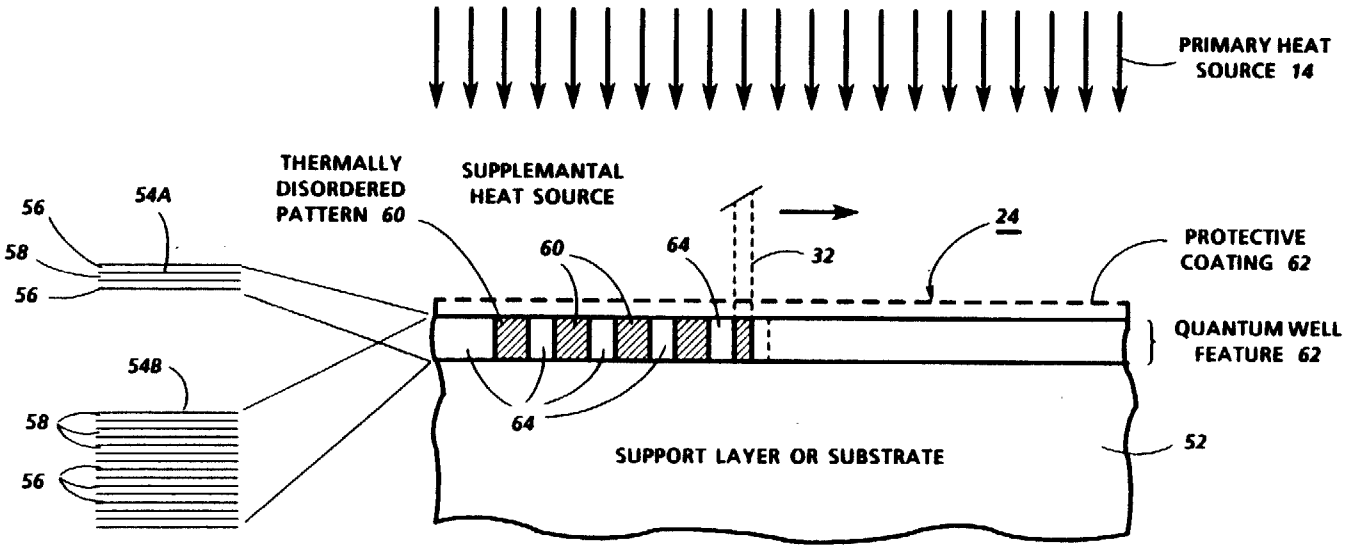
FIG. 3 is a schematic illustration of the processing of a semiconductor structure including a quantum well feature in accordance with the teachings of this invention.

Reference is now made to FIG. 3, which illustrates in greater detail the minimal semiconductor structure required for treatment in accordance with this invention. Semiconductor structure 24 comprises a support means 52 which may be comprised of a substrate, e.g., GaAs, or an epitaxially deposited layer, such as GaAs or $Ga_{1-x}Al_xAs$ deposited on a GaAs substrate. Epitaxially deposited quantum well feature 54 which may comprise a single well structure 54A or a multiple quantum well structure 54B. Single quantum well structure 54A may consist of an active well layer 58 interposed between two inner cladding layers 56 which may be adjacent to outer cladding layers of a semiconductor device. Multiple quantum well structure 54B comprises alternating well layers 58 and barrier layers 56. Well layers 58 are sufficiently thin to exhibit quantum size effects. Well layers 58 may be comprised of GaAs or $Ga_{1-y}Al_yAs$ where y is of low value. Barrier layers 56 may, for example, be comprised of AlAs or $Ga_{1-z}Al_zAs$ where $z>y$. Examples of well/barrier combinations are GaAs/AlAs or $Ga_{1-y}Al_yAs/Ga_{1-z}Al_zAs$ or $GaAs/Ga_{1-y}Al_yAs$, as is known in the art.

It should be noted that the method of this invention may also be applied to a conventional heterostructure, e.g a layer, not sufficiently thin to exhibit quantum size effects, and of narrow bandgap material, such as GaAs, deposited on a wider bandgap material, such as $Ga_{1-x}Al_xAs$, or sandwiched between two layers of wider bandgap material. Disordering may not occur to the extent exhibited by thinner quantum well layers but disordering is quite sufficient to bring about optically recognizable differences in refractive index properties.

Returning now to FIG. 1, chamber 34 of apparatus 10 may be evacuated prior to processing and provided with an As environment via convenient access to the chamber. Processing is initiated by providing the As environment in chamber 34. Structure 24 is then heated to a temperature below which thermal disordering will rapidly occur in quantum well feature 54, i.e., at which no or very little disordering will occur or at which the rate of disorder conversion that could take place would be small. For the GaAs/GaAlAs regime, this background temperature is about 750° C. to 850° C. A heavy current comprising one hundred amps or more is passed through heater element 16 to raise the temperature of wafer 24 from ambient to the background temperature in the presence of the As environment, e.g. $AsH_3$. Heater element 16 has low thermal mass and therefore this temperature rise is achieved rapidly, e.g., within the period of a minute.

The purpose of the As environment in chamber 34 is to prevent the outdiffusion of element As from wafer 24 during thermal processing. As is volatile at temperatures above 750° C. so that will dissipate out of wafer 24 during thermal processing temperatures in the range of temperatures contemplated. An Alternative method to prevent As outdiffusion is the provision of a protective layer 62 (shown in dotted line in FIG. 3) of $Si_3N_4$, $SiO_2$, $Al_2O_3$ or $ZrO_2$ may be provided on the exterior surfaces of wafer 24. The employment of protective layer 62 may be utilized in lieu of the As environment in chamber 34, in which case, chamber 34 may be pressurized to help prevent any outdiffusion. As a further alternative, a combination of the As environment and protective layer 62 may be employed to prevent As outdiffusion.

After wafer 24 has reached the desired background temperature, e.g. 750° C. to 850° C., scanner 26 is operated to selectively disorder predefined areas 60 (FIG. 3) of structure 24. The output power beam 32 need not be of great magnitude because the additional temperature rise needed to provide for enhanced or accelerated disordering, e.g. 25° C. to 50° C. above the temperature level provided by primary heat source 16. Of course, the amount of output power is dependent on the rate of scanning. Scanner 26 directs beam 32 along the surface of wafer 24 to provide a pattern of disordered alloy 60 as illustrated in FIG. 3. The thermally disordered pattern 60 represents regions of quantum well feature 54 that provide an interdiffusion of Ga and Al between well layer or layers 58 and barrier layers 56 so that the resultant alloy comprising GaAlAs will have an overall higher bandgap and lower refractive index compared to undisordered regions 64. As a result, waveguide and current confinement features can be patterned into quantum well feature 54 so that three dimensional structuring of integrated circuits, electro-optic integrated circuitry, waveguide structures, semiconductor devices including semiconductor lasers is possible by patterned disordering without producing a large thermal gradient in wafer 24 which will crack or damage the crystal structure rendering it useless for semiconductor devices.

It should be noted that the method of this invention may also be applied directly in a the reactor of a molecular beam epitaxy (MBE) system or a metalorganic chemical vapor deposition (MOCVD) system. The system already has a primary heat source. A focused laser source may be mounted in the reactor and programmed to direct the laser beam onto the surface of semiconductor structure positioned on the septrum in the reactor.

Figure 2:
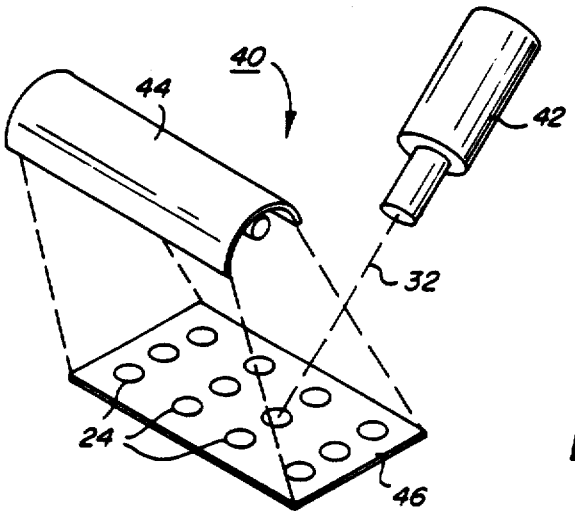
FIG. 2 schematically illustrates another fundamental apparatus for carrying out this invention.

FIG. 2 represents another apparatus to carry out this invention. Like apparatus 10, apparatus 40 may be confined in an enclosure or housing 14 within which is provided with an As environment. The primary heat source 16 in the case here, however, is a light source 44, such as a zenon lamp, capable of being energized to provide high temperature heating in a relatively short time, e.g., above 800° C. in less than a few seconds. A plurality of semiconductor structures 24 are supported on tray 46. With uniform heat supplied by lamp 44, laser scanner 42 scans beam 32 in a predetermined pattern on each of the structures 24 to form a predefined thermally disordered pattern 60 (FIG. 3) in the quantum well feature 54 present in each structure 24.

Figure 4:
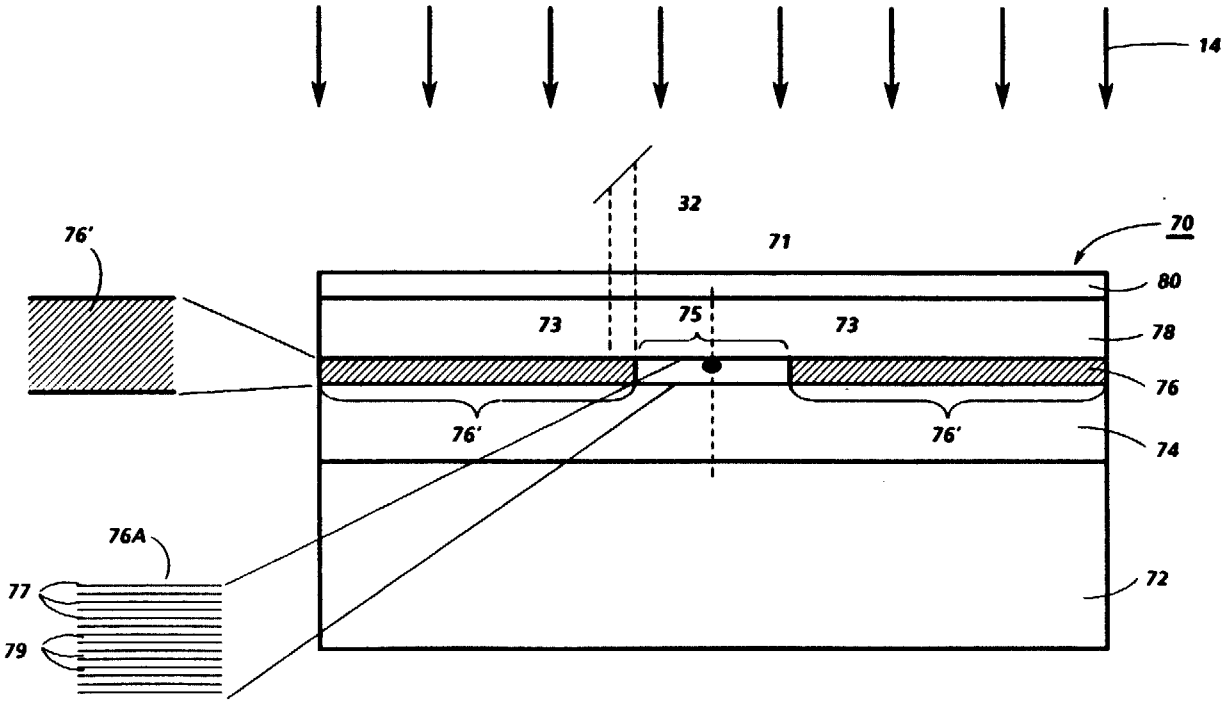
FIG. 4 is a schematic illustration of a semiconductor laser being processed in accordance with the teachings of this invention.

FIG. 4 illustrates the application of the above described method relative to the fabrication of a particular semiconductor device, in this case semiconductor laser 70. Laser 70 may comprise a substrate 72 of n-GaAs upon which is epitaxially deposited a cladding layer 74 of n-$Ga_{1-x}Al_xAs$, an active region 76 comprising a multiple quantum well structure 76A of p, n or nondoped alternating layers of GaAs (wells 77) and $Ga_{1-y}Al_yAs$ where $x>y$ (barriers 79), a cladding layer 78 of p-$Ga_{1-x}Al_xAs$ and cap layer 80 of $p^+$-GaAs. At this stage of fabrication of laser 70 or of the wafer containing laser 70 as a semiconductor component thereof, is treatment is continued in apparatus 10 or 40. Laser 70 is initially heated to a background temperature in the range of 850° C. to 875° C. by primary heat source 116 or 44. Then, laser beam 32 is scanned in a predefined manner to thermally convert regions 76' of multiple quantum well 76A to a disordered alloy as represented by the cross-hatched regions 76' in FIG. 4. This leaves region 75 of active region 76 comprising undisturbed multiple quantum well structure 76A forming the active lasing region for laser 70. Due to the high bandgap and lower refractive index properties of adjacent regions 76', region 75 will act as a waveguide medium in the plane 71 perpendicular to plane of FIG. 4 for photon generation due to carrier recombination in proximity to the p-n junction of the laser.

One advantage of the method of thermal disordering of this invention is that the thermal gradient developed in areas of structure 24 between regions scanned by beam 32 and adjacent regions uniformly heated by the primary heating source may not produce sharp bandgap edges or sharp refractive index profiles between partially or fully disordered material and undisordered material which is not desirable for some semiconductor device applications, e.g. phased coupled arrays, directional couplers and transparent waveguides. Such edges would be at points 73 in laser 70. In the case of semiconductor devices such as laser 70, a gradual change or gradient in bandgap and refractive index at points 73 would be desirable for providing good lateral waveguiding properties, which also may be true for other optical waveguide applications.

Figure 5:
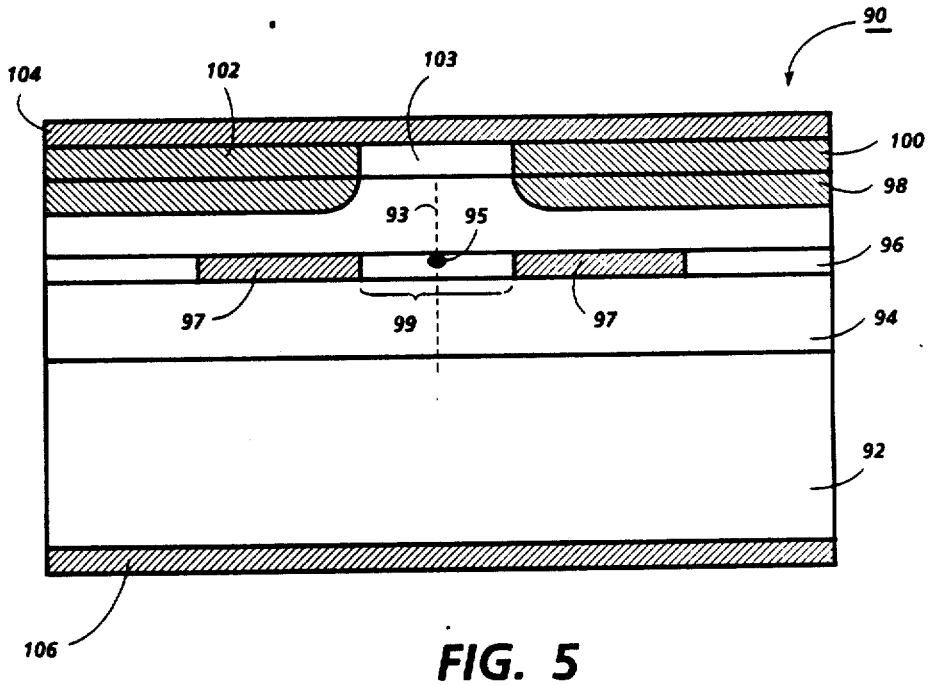
FIG. 5 is a schematic illustration of a semiconductor laser similar to the laser of FIG. 4 except processed in a slightly different manner.

Semiconductor laser 90 in FIG. 5 is substantially similar to laser 70 in FIG. 4 except for the extent of disordered material in the active region 96 and the employment of a proton implant to provide for current pumping delineation. Laser 90 may comprise a substrate 92 of n-GaAs upon which is epitaxially deposited a cladding layer 94 of n-$Ga_{1-x}Al_xAs$, an active region 96 comprising a multiple quantum well structure of p, n or nondoped alternating layers of GaAs and $Ga_{1-y}Al_yAs$ where $x>y$, a cladding layer 98 of p-$Ga_{1-x}Al_xAs$ and cap layer 100 of $p^+$-GaAs. Treatment according to the method of this invention is carried out in the same manner as explained relative to laser 70 except that disordering is limited to regions 97 of active region 96. This leaves a region 99 of active region 96 comprising undisordered quantum well feature forming the active lasing region for laser 90 represented by the point 95 of light emission. Due to the high bandgap and lower refractive index properties of adjacent regions 97, region 99 will act as a waveguide medium in the plane 93 of the laser structure.

Fabrication is continued with the proton implants 102 to delineate a current stripe 103. Fabrication is completed with the deposit of metal contacts 104 and 106. The disordered regions 97 do not need to extend the ends of the active region 96 as long as good current confinement properties are provided to the region of plane 93.

It should be also noted that more than one scanner and laser beam 32 may be utilized in the practice of the method of this invention. For example, two or more laser beams with different wavelengths may be utilized wherein each respective wavelength provides a different absorption factor so that one wavelength will be more absorptive relative to a given bandgap material comprising one layer of the semiconductor structure compared to another given bandgap material comprising another layer of the semiconductor structure. In this manner, each beam selectively heats different regions of the layered semiconductor structure having respectively different bandgap properties.

Lastly, it should be noted that a quantum well feature may be provided either in lieu of or as a portion of either or both cladding layers 74 or 78, or cladding layers 94 and 98 in addition to such a feature being provided in active layer 76 of laser 70 of FIG. 4 or active layer 96 of FIG. 5. Also, other types of quantum well features may be used in the active region other then the multiple quantum well illustrated in FIGS. 5 and 6, such as, a single quantum well or separate confinement single or multiple quantum well. Also, a conventional heterostructure laser having a single active region may be utilized as a well feature in lieu of a quantum well feature.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method of converting selected areas of a semiconductor structure into a disordered alloy via thermal disordering comprising a well feature epitaxially deposited on a semiconductor support, said well feature comprising at least one first well layer of narrow bandgap material deposited adjacent to at least a second layer of wider bandgap material or interposed between second and third layers of wider bandgap material, said disordered alloy exhibiting higher bandgap and lower refractive index properties than said first layer and comprising the steps of:

(a) placing said structure within a protective environment to prevent the escape of volatile components from said structure during subsequent processing, (b) heating said structure to a background temperature [just] below the temperature required to achieve rapid thermal disordering of said feature, (c) scanning said structure with a laser beam while maintaining said background temperature to disorder said well feature in selected regions scanned by said laser beam, said disordering achieved due to the additional heat supplied by said laser beam forming a pattern of wider bandgap and lower refractive index properties proscribed in said feature by the scanning trace of said laser beam compared to areas of said feature not scanned by said laser beam.

2. The method of claim 1 wherein said well feature is a single quantum well structure, a multiple quantum well structure or a separate confinement single quantum well or a separate confinement multiple quantum well.

3. The method of claim 1 wherein said well feature is a heterostructure including an active region comprising said first layer.

4. The method of any one of claims 1, 2 and 3 wherein there is a protective coating applied to the exterior surfaces of said structure.

5. The method of claim 4 wherein said protective coating is selected from the group consisting of $SiO_2$, $Si_3N_4$, $Al_2O_3$ and $ZrO_2$.

6. The method of any one of claims 1, 2 and 3 wherein said step of background heating is provided in the range of 750° C. to 850° C. and said laser provides an additional elevated temperature in the range of 25° C. to 50° C.

7. The method of any one of claims 1 and 2 wherein said well feature comprises a quantum well structure having well layer(s) selected from the group consisting of GaAs and $Ga_{1-y}Al_yAs$ and barrier layers selected from the group consisting of AlAs and $Ga_{1-y}Al_zAs$ where $z>y$.

8. A method of converting selected areas of a semiconductor structure into a disordered alloy via thermal disordering comprising a well feature epitaxially deposited on a semiconductor support, said well feature comprising at least one first well layer of narrow bandgap material deposited adjacent to at least a second layer of wider bandgap material or interposed between second and third layers of wider bandgap material, said disordered alloy exhibiting higher bandgap and lower refractive index properties than said first layer and comprising the steps of:

(a) covering said structure with a protective coating to prevent the escape of any elemental component of said structure, (b) heating said structure to a background temperature [just] below the temperature required to achieve rapid thermal disordering of said feature, (c) scanning said structure with a laser beam while maintaining said background temperature to selectively disorder said well feature in a pattern proscribed by the scanning trace of said laser beam.

9. The method of claim 8 wherein said well feature is selected from the group consisting of a single quantum well structure, a multiple quantum well structure, a separate confinement single quantum well and a separate confinement multiple quantum well.

10. The method of claim 8 wherein said well feature is a heterostructure including an active region comprising said first layer.

11. The method of any one of claims 8, 9 and 10 wherein said step of background heating is provided in the range of 750° C. to 850° C. and said laser provides an additional elevated temperature in the range of 25° C. to 50° C.

12. The method of any one of claims 8 and 9 wherein said well feature comprises a quantum well structure having well layer(s) selected from the group consisting of GaAs and $Ga_{1-y}Al_yAs$ and barrier layers selected from the group consisting of AlAs and $Ga_{1-z}Al_zAs$ where $z>y$.

13. The method of claim 8 wherein said protective coating is selected from the group consisting of $SiO_2$, $Si_3N_4$, $Al_2O_3$ and $ZrO_2$.

* * * * *